United States Patent
Na et al.

(10) Patent No.: US 9,030,907 B2
(45) Date of Patent: May 12, 2015

(54) SEMICONDUCTOR DEVICE AND SEMICONDUCTOR SYSTEM WITH THE SAME

(71) Applicant: SK Hynix Inc., Gyeonggi-do (KR)

(72) Inventors: Kwang-Jin Na, Gyeonggi-do (KR); Tae-Wook Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,809

(22) Filed: Dec. 15, 2013

(65) Prior Publication Data

US 2015/0098296 A1   Apr. 9, 2015

(30) Foreign Application Priority Data

Oct. 7, 2013   (KR) .................. 10-2013-0119074

(51) Int. Cl.
*G11C 8/00* (2006.01)
*G11C 8/18* (2006.01)

(52) U.S. Cl.
CPC ........................ *G11C 8/18* (2013.01)

(58) Field of Classification Search
USPC ............................................. 365/233.1
See application file for complete search history.

(56) References Cited

U.S. PATENT DOCUMENTS 6,801,989 B2 * 10/2004 Johnson et al. .............. 711/167
7,159,092 B2 *  1/2007 Johnson et al. .............. 711/167

FOREIGN PATENT DOCUMENTS

KR   1020100006873   1/2010

* cited by examiner

*Primary Examiner* — Hoai V Ho
*Assistant Examiner* — Pablo Huerta
(74) *Attorney, Agent, or Firm* — IP & T Group LLP

(57) ABSTRACT

A semiconductor device includes a first internal clock generation unit suitable for generating a first internal clock for synchronizing a first signal in response to a first external clock; a second internal clock generation unit suitable for generating a second internal clock for synchronizing a second signal in response to a second external clock; and a delay amount information provision unit suitable for providing delay amount information corresponding to a phase difference between the first internal clock and the second internal clock to an external device.

20 Claims, 7 Drawing Sheets

SEMICONDUCTOR DEVICE AND SEMICONDUCTOR SYSTEM WITH THE SAME

CROSS-REFERENCE TO RELATED APPLICATIONS

The present application claims priority of Korean Patent Application No. 10-2013-0119074, filed on Oct. 7, 2013, which is incorporated herein by reference in its entirety.

BACKGROUND

1. Field

Exemplary embodiments of the present invention relate to a semiconductor design technology, and more particularly, to a semiconductor device supporting a training mode and a semiconductor system with the same.

2. Description of the Related Art

A semiconductor device becomes more integrated and of higher speed depending on demands. A semiconductor device uses a plurality of clocks according to target elements due to a high-speed operation.

For example, a dynamic random access memory (DRAM) uses a data clock and a command clock, which synchronizes a command. That is, a memory device such as the DRAM receives or outputs data using the data clock, and receives a command and an address using the command clock. The data clock has a high frequency, for example 2 GHz, and the command clock has a relatively lower frequency, for example, 1 GHz. A high-speed memory device with an operation speed of 4 Gbps is realized with the data clock and the command clock.

When the plurality of clocks are not synchronized or arranged, the semiconductor device cannot perform normal operations due to a time skew between the clocks. The semiconductor device performs a training mode in order to arrange or synchronize the plurality of clocks. The training mode is a process of training before entering a normal mode for optimized operation performance in the normal mode.

The training mode will be described with a conventional memory device as an example.

FIG. 1 is a block diagram illustrating a conventional memory device.

Referring to FIG. 1, the conventional memory device 10 includes a command pad HCK, a command clock buffer unit 11, a data pad WCK, a data clock input unit 13, a phase information provision unit 15, and a phase information pad EDC.

An external command clock eHCK having a low frequency, for example 1 GHz, is received through the command pad HCK. The command clock buffer unit 11 generates an internal command clock iHCK in response to the external command clock eHCK. An external data clock eWCK having a high frequency, for example 2 GHz, is received through the data pad WCK. The data clock input unit 13 generates an internal data division clock iWCK_DVD having the same frequency as the internal command clock iHCK in response to the external data clock eWCK. The phase information provision unit 15 generates a phase information signal ePD between the internal command clock iHCK and the internal data division clock iWCK_DVD in response to a training mode signal TM. The phase information pad EDC outputs the phase information signal ePD to the external device.

The data clock input unit 13 includes a data clock buffer unit 13A and a dividing unit 13B.

The data clock buffer unit 13A generates an internal data clock iWCK in response to the external data clock eWCK. The dividing unit 13B generates the internal data division clock iWCK_DVD by dividing the internal data clock iWCK. The internal data division clock iWCK_DVD is one of first to fourth internal data division clocks (not illustrated) respectively corresponding to 4 phases of 0°, 90°, 180° and 270° to the internal data clock iWCK.

The phase information provision unit 15 includes a replica delay unit 15A, a phase comparing unit 15B and an output driver unit 15C.

The replica delay unit 15A outputs a delay division clock iWCK_DLY by delaying the internal data division clock iWCK_DVD by a preset delay amount. The phase comparing unit 15B compares phases of the delay division clock iWCK_DLY and the internal command clock iHCK. The output driver unit 15C drives a phase comparison signal iPD output from the phase comparing unit 15B to the phase information pad EDC.

The replica delay unit 15A is provided in order to synchronize an internal delay amount reflected in the internal command clock iHCK with an internal delay amount reflected in the internal data division clock iWCK_DVD. Even though not illustrated in FIG. 1, the internal delay amount reflected in the internal command clock iHCK is greater than the internal delay amount reflected in the internal data division clock iWCK_DVD. If the internal delay amount reflected in the internal command clock iHCK is less than the internal delay amount reflected in the internal data division clock iWCK_DVD, the replica delay unit 15A would be disposed on a transmission line of the internal command clock iHCK.

An operation of the memory device 10 will be described with reference to FIG. 2.

FIG. 2 is a timing diagram illustrating a training process of the conventional memory device 10.

Referring to FIG. 2, an external controller (not illustrated) generates and provides the external command clock eHCK and the external data clock eWCK to the conventional memory device 10 at an initial operation. The conventional memory device 10 internally generates the internal command dock iHCK corresponding to the external command clock eHCK and the internal data division clock iWCK_DVD corresponding to the external data dock eWCK and enters the training mode under the control of the external controller.

After entering the training mode in response to an activation of the training mode signal TM, the conventional memory device 10 samples one of the internal command clock iHCK and the internal data division clock iWCK_DVD based on the other one of the internal command clock iHCK and the internal data division clock iWCK_DVD, and generates and provides the phase information signal ePD in response to a sampling result to the external controller.

In detail, the replica delay unit 15A outputs the delay division clock iWCK_DLY by delaying the internal data division clock iWCK_DVD by the preset delay amount. The phase comparing unit 15B compares the phases of the delay division clock iWCK_DLY and the internal command clock iHCK and outputs the phase comparison signal iPD in response to the comparison result. The output driver unit 15C drives the phase information signal ePD corresponding to the phase comparison signal IPD to the phase information pad EDC.

For example, the phase comparing unit 15B generates the phase comparison signal iPD of a logic high level or a logic low level according to a phase relationship between the delay division clock iWCK_DLY and the internal command clock iHCK, and the output driver unit 15C provides the phase information signal ePD of the logic high level or the logic low level to the external controller through the phase information pad EDC in response to the phase comparison signal iPD.

The external controller adjusts one of phases of the external command clock eHCK and the external data clock eWCK in response to the phase information signal ePD. For example, the external controller shifts the phase of the external data clock eWCK backward when the phase of the delay division clock iWCK_DLY leads the phase of the internal command clock iHCK, and shifts the phase the external data clock eWCK forward when the phase of the internal command clock iHCK leads the phase of the delay division clock iWCK_DLY.

The process of moving forward and backward is repeated until the phases of the Internal command clock iHCK and the delay division clock iWCK_DLY are identical to each other. For example, the external controller shifts backward the phase of the external data clock eWCK by a preset amount of level when the phase of the delay division clock iWCK_DLY leads the phase of the internal command clock iHCK, and then stops the training operation when the phase of the internal command clock iHCK leads the phase of the delay division clock iWCK_DLY.

Accordingly, optimal operation circumstance in the normal mode may be provided to the memory device 10 by making the phases of the internal command clock iHCK and the delay division clock iWCK_DLY identical to each other.

However, the conventional memory device 10 has a concern as follows.

The memory device 10 generates the phase information signal ePD according to the phase relationship between the delay division clock iWCK_DLY corresponding to the external data clock eWCK and the internal command clock iHCK corresponding to the external command clock eHCK. The memory device 10 provides simple phase information denoting which one of phases of the Internal command clock iHCK and the delay division clock iWCK_DLY leads to the other, and generates the phase information signal ePD of single bit having the logic high level or the logic low level.

The external controller adjusts one of the phases of the external command clock eHCK and the external data clock eWCK in response to the phase information signal ePD. The external controller adjusts one of the phases of the external command clock eHCK and the external data clock eWCK step by step by the preset amount of level, which means that there are more steps to adjust one of the phases of the external command clock eHCK and the external data clock eWCK as a phase difference between the external command clock eHCK and the external data clock eWCK becomes greater. Thus, there needs more time for the training operation as the phase difference between the external command clock eHCK and the external data clock eWCK becomes greater.

SUMMARY

Various exemplary embodiments of the present invention are directed to a semiconductor device capable of generating various phase information in a training mode and semiconductor system with the same.

In accordance with an exemplary embodiment of the present invention, a semiconductor device may include a first internal clock generation unit suitable for generating a first internal clock for synchronizing a first signal in response to a first external clock; a second internal clock generation unit suitable for generating a second internal clock for synchronizing a second signal in response to a second external clock; and a delay amount information provision unit suitable for providing delay amount information corresponding to a phase difference between the first internal clock and the second internal clock to an external device.

In accordance with an exemplary embodiment of the present invention, a semiconductor device may include a first internal clock generation unit suitable for generating a first internal clock for synchronizing a first signal in response to a first external clock having a first frequency; a second internal clock generation unit suitable for generating a second internal clock for synchronizing a second signal in response to a second external clock having a second frequency higher than the first frequency, wherein the second internal clock has the same frequency as the first internal clock; and a delay amount information provision unit suitable for providing delay amount information, which indicates where a delay amount corresponding to a phase difference between the first internal clock and the second internal clock falls in among a plurality of preset delay amount ranges, to an external device in a training mode.

In accordance with an exemplary embodiment of the present invention, a semiconductor system may include a controller suitable for generating a first source clock having a first frequency and a second source clock having a second frequency higher than the first frequency, and adjusting one of phases of the first source clock and the second source clock by a plurality of level units based on delay amount information in a training mode; and a semiconductor device suitable for generating a first Internal clock, in which a first internal delay amount is reflected, in response to the first source clock, and a second internal clock, in which a second internal delay amount is reflected, in response to the second source clock, and providing the delay amount information, which indicates where a delay amount corresponding to a phase difference between the first internal clock and the second internal clock falls in among a plurality of preset delay amount ranges, to the controller in the training mode.

In accordance with the exemplary embodiments of the present invention, in a training mode to make phases of two clocks identical to each other, a semiconductor system may adjust one of the phases of two clocks in units of a coarse level or a fine level according to various phase information between two clocks, and thus minimize time in the training mode.

DETAILED DESCRIPTION

Figure 1:
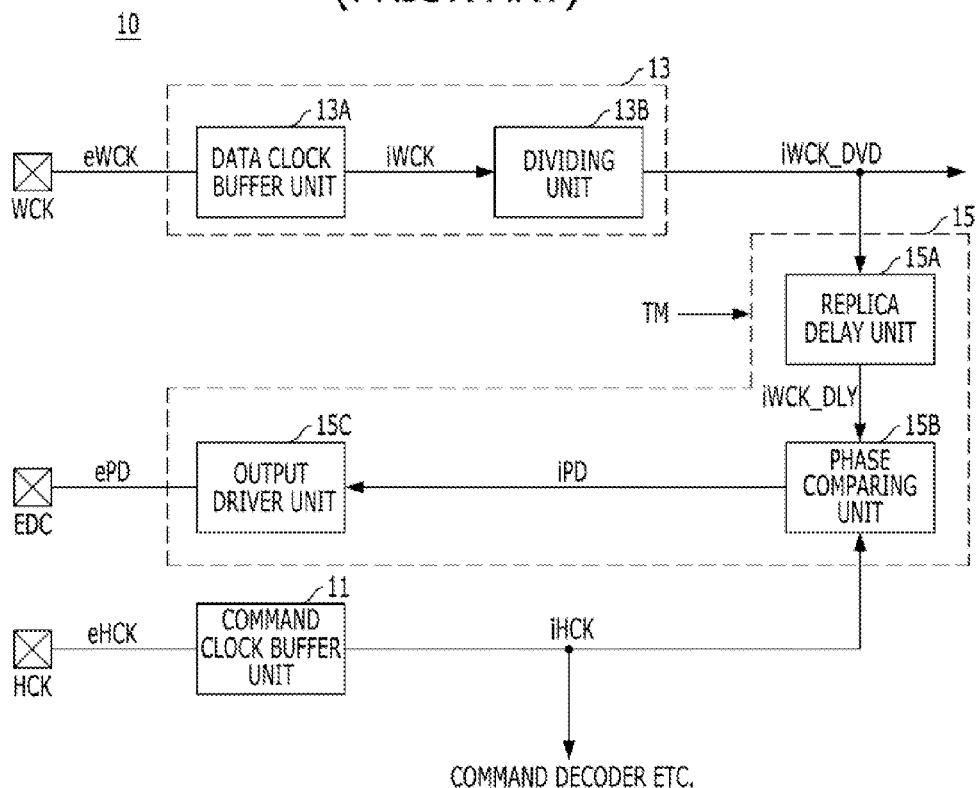
FIG. 1 is a block diagram illustrating a conventional memory device.
Figure 2:
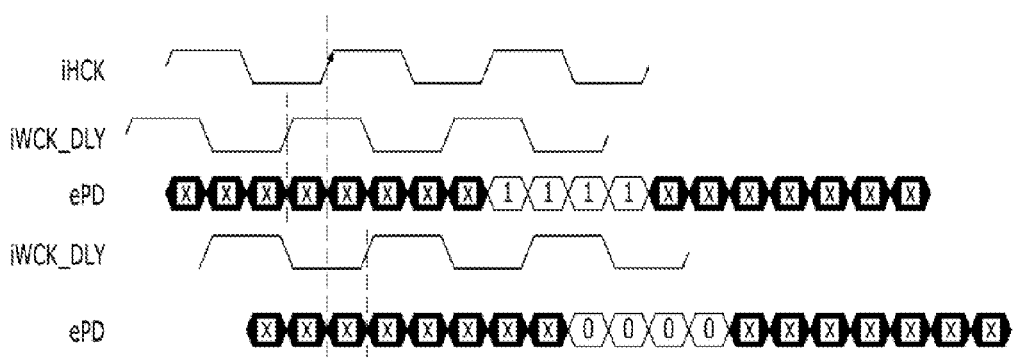
FIG. 2 is a timing diagram illustrating a training process of the conventional memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

In the description, an external clock and an internal clock are divided based on a semiconductor device, and a memory device is taken as an example of the semiconductor device.

Figure 3:
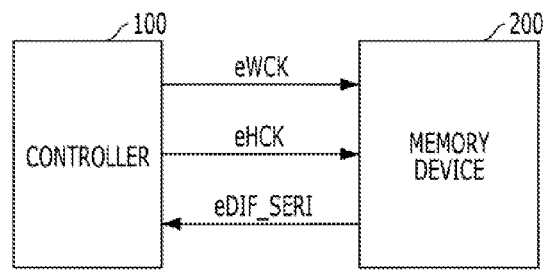
FIG. 3 is a block diagram illustrating a semiconductor system in accordance with an exemplary embodiment of the present invention.

FIG. 3 is a block diagram illustrating a semiconductor system in accordance with an exemplary embodiment of the present invention.

Referring to FIG. 3, the semiconductor system may include a controller 100 and a memory device 200.

The controller 100 may generate an external command clock eHCK and an external data clock eWCK, and adjust one of phases of the external command clock eHCK and the external data clock eWCK by a plurality of level units based on an external delay amount information eDIF_SERI in a training mode.

The memory device 200 may generate the external delay amount information eDIF_SERI in response to the external command clock eHCK and the external data clock eWCK at every preset period in the training mode.

The controller 100 may be a control unit for controlling overall operations of the memory device 200 and include a processor such as a graphic processing unit (GPU). In the training mode, the controller 100 may adjust one of the phases of the external command clock eHCK and the external data clock eWCK in units of a coarse level or a fine level based on the external delay amount information eDIF_SERI provided from the memory device 200 at every preset period.

For example, in the training mode, the controller 100 may shift backward the phase of the external data clock eWCK in units of a coarse level or a fine level based on the external delay amount Information eDIF_SERI.

The controller 100 may generate the external command clock eHCK having a first frequency, for example 1 GHz, and the external data clock eWCK having a second frequency higher than the first frequency, for example 2 GHZ, since data may be input or output with a higher speed than a command.

Even though not illustrated in FIG. 3, the controller 100 may provide a command and/or an address synchronized with the external command clock eHCK and data synchronized with the external data clock eWCK to the memory device 200.

The memory device 200 may generate a first internal clock by delaying the external command clock eHCK by an amount of internal delay reflected in a first internal clock path, and a second Internal clock by delaying the external data clock eWCK by an amount of internal delay reflected in a second internal clock path, and provide the external delay amount information eDIF_SERI to the controller 100 in the training mode. The external delay amount Information eDIF_SERI may indicate an amount of delay corresponding to a phase difference between the first and second internal clocks and may indicate where the amount of delay falls in among a plurality of preset delay amount ranges. The first internal clock may correspond to an internal command clock iHCK, and the second internal clock may correspond to an internal data division clock iWCK_DVD.

Figure 4:
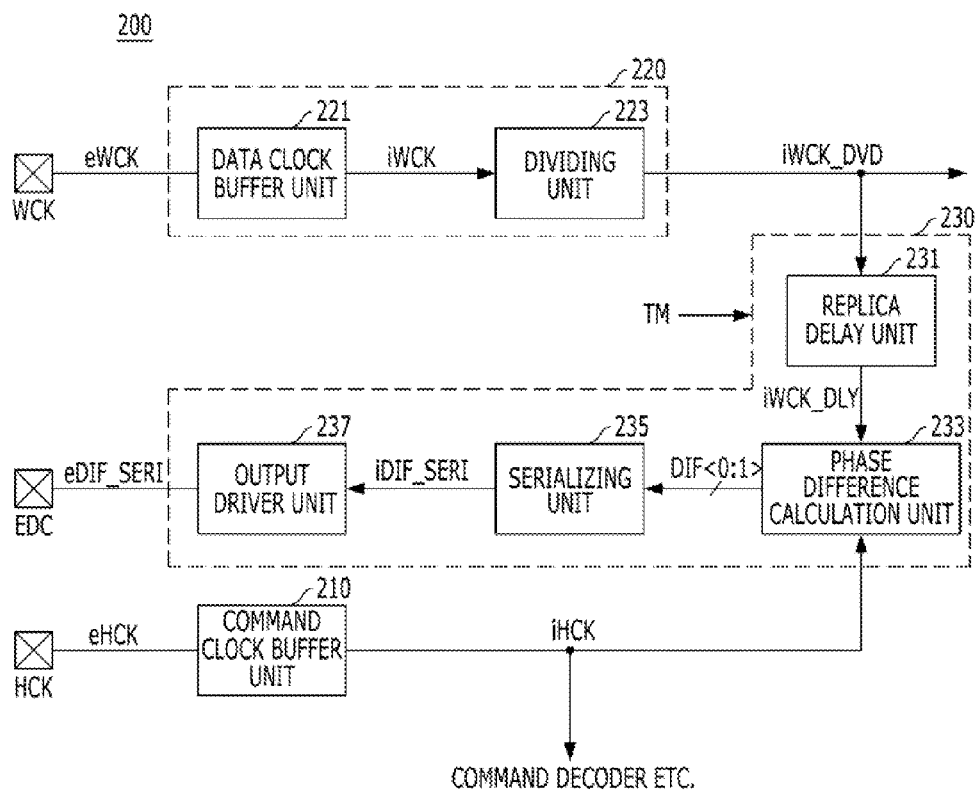
FIG. 4 is a block diagram illustrating a semiconductor device shown in FIG. 3.

FIG. 4 is a block diagram illustrating the memory device 200 shown in FIG. 3.

Referring to FIG. 4, the memory device 200 may include a command pad HCK, a command clock buffer unit 210, a data pad WCK, a data clock input unit 220, a delay amount information provision unit 230 and a delay amount information pad EDC.

The external command clock eHCK may be received through the command pad HCK. The command clock buffer unit 210 may generate the internal command clock iHCK in response to the external command clock eHCK. The external data clock eWCK may be received through the data pad WCK. The data clock input unit 220 may generate the internal data division clock iWCK_DVD having the same frequency as the internal command clock iHCK in response to the external data clock eWCK. The delay amount information provision unit 230 may generate the external delay amount information eDIF_SERI corresponding to a phase difference between the internal command clock iHCK and the internal data division clock iWCK_DVD in response to a training mode signal TM. The delay amount information pad EDC outputs the external delay amount information eDIF_SERI to the controller 100.

The data clock input unit 220 may include a data clock buffer unit 221 and a dividing unit 223.

The data clock buffer unit 221 may generate an internal data clock iWCK in response to the external data clock eWCK. The dividing unit 223 may generate the internal data division clock iWCK_DVD by dividing the internal data clock iWCK. The internal data division clock iWCK_DVD is one of first to fourth internal data division clocks (not illustrated) respectively corresponding to 4 phases of 0°, 90°, 180° and 270° of the internal data clock iWCK.

The delay amount information provision unit 230 may include a replica delay unit 231, a phase difference calculation unit 233, a serializing unit 235, and an output driver unit 237.

The replica delay unit 231 may output a delay division clock iWCK_DLY by delaying the internal data division clock iWCK_DVD by a modelled delay amount. The phase difference calculation unit 233 may output first and second delay amount information signals DIF<0:1> corresponding to a phase difference between the delay division clock iWCK_DLY and the internal command clock iHCK in parallel. The serializing unit 235 may serialize the first and second delay amount information signals DIF<0:1> and output an internal delay amount Information iDIF_SERI. The output driver unit 237 may drive the internal delay amount information iDIF_SERI output in series from the serializing unit 235 as the external delay amount information eDIF_SERI.

The replica delay unit 231 may be provided in order to synchronize an internal delay amount reflected in the internal command clock iHCK with an internal delay amount reflected in the internal data division clock iWCK_DVD. Even though not illustrated in FIG. 4, the internal delay amount reflected in the internal command clock iHCK is greater than the internal delay amount reflected in the internal data division clock iWCK_DVD. If the internal delay amount reflected in the internal command clock iHCK is less than the internal delay amount reflected in the internal data division clock iWCK_DVD, the replica delay unit 231 would be disposed on a transmission line of the internal command clock iHCK.

Figure 5:
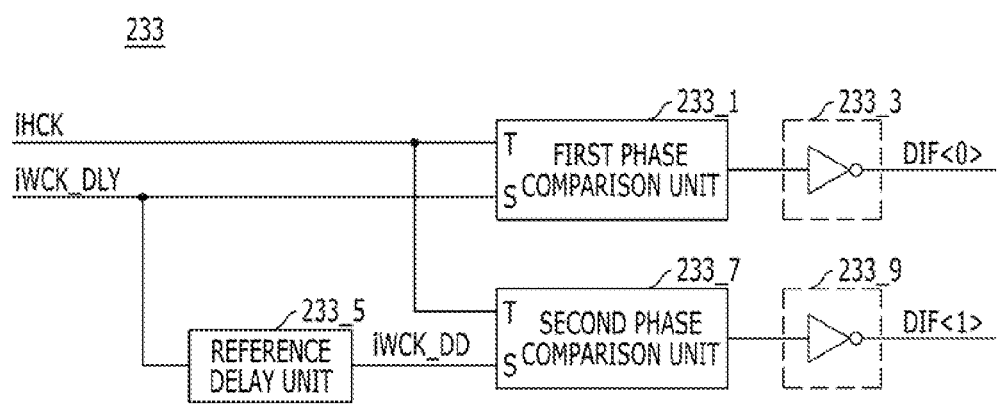
FIG. 5 is a block diagram illustrating a phase difference calculation unit shown in FIG. 4.

FIG. 5 is a block diagram illustrating the phase difference calculation unit 233 shown in FIG. 4.

Referring to FIG. 5, the phase difference calculation unit 233 may include a first phase comparison unit 233_1, a first output unit 233_3, a reference delay unit 233_5, a second phase comparison unit 233_7 and a second output unit 233_9.

The first phase comparison unit 233_1 may compare phases of the internal command clock iHCK and the delay division clock iWCK_DLY. The first output unit 233_3 may output an output signal of the first phase comparison unit 233_1 as the first delay amount information signal DIF<0>. The reference delay unit 233_5 may delay the delay division clock iWCK_DLY by a preset delay amount and may output an additional delay division clock iWCK_DD. The second phase comparison unit 233_7 may compare phases of the internal command clock iHCK and the additional delay division clock iWCK_DD. The second output unit 233_9 may output an output signal of the second phase comparison unit 233_7 as the second delay amount information signal DIF<1>.

The delay amount information pad EDC may be an unused pad in the training mode. For example, the delay amount information pad EDC may be a pad for providing a Cyclic Redundancy Check (CRC) code to the controller 100 in a normal mode. The delay amount information pad EDC may be a common pad providing different signals respectively in different operation modes. The command pad HCK and the data pad WCK are dedicated pads for the external command clock eHCK and the external data clock eWCK, respectively.

An operation of the semiconductor system described above will be described with reference to FIG. 6.

Figure 6:
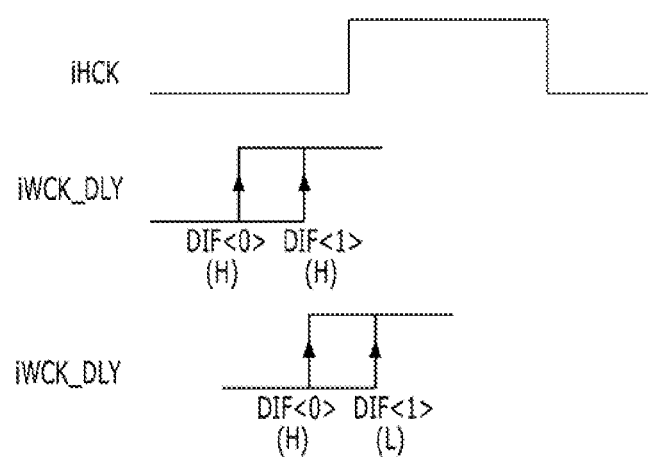
FIG. 6 is a timing diagram illustrating a training process of the semiconductor system shown in FIGS. 3 to 5.

FIG. 6 is a timing diagram illustrating a training process of the semiconductor system shown in FIGS. 3 to 5.

Referring to FIG. 6, the controller 100 may generate and provide the external command clock eHCK having a low frequency, for example 1 GHz, and the external data clock eWCK having a high frequency, for example 2 GHz, to the memory device 200 at an initial operation. The memory device 200 may internally generate the internal command clock iHCK corresponding to the external command clock eHCK and the internal data division clock iWCK_DVD corresponding to the external data clock eWCK, and may enter the training mode under the control of the controller 100.

For example, the memory device 200 may enter the training mode when the training mode signal TM, which is stored in a mode register set (MRS), is activated in response to a preset address and a preset command output from the controller 100.

After entering the training mode in response to an activation of the training mode signal TM, the memory device 200 may provide the external delay amount information eDIF_SERI, which may indicate where the amount of delay corresponding to a phase difference between the internal command clock iHCK and the Internal data division clock iWCK_DVD falls in among a plurality of preset delay amount ranges, to the controller 100.

In detail, the replica delay unit 231 may output the delay division clock iWCK_DLY by delaying the internal data division clock iWCK_DVD by the modelled delay amount. The modelled delay amount may be referred to as a fixed amount of delay corresponding to a difference between the internal delay amount reflected in the internal command clock iHCK and the internal delay amount reflected in the internal data division clock iWCK_DVD.

The phase difference calculation unit 233 may sample the phase of the delay division clock iWCK_DLY based on the phase of the internal command clock iHCK, may and generate the first delay amount information signal DIF<0> in response to the sampling result. The phase difference calculation unit 233 may sample the phase of the additional delay division clock iWCK_DD based on the phase of the internal command clock iHCK, and may generate the second delay amount information signal DIF<1> in response to the sampling result.

For example, the phase difference calculation unit 233 may generate the first delay amount information signal DIF<0> having a logic high level when the phase of the delay division clock iWCK_DLY leads the phase of the internal command clock iHCK. The phase difference calculation unit 233 may generate the second delay amount information signal DIF<1> having a logic high level when the phase of the additional delay division clock iWCK_DD leads the phase of the internal command clock iHCK.

The serializing unit 235 may serialize the first and second delay amount information signals DIF<0:1> and may output the internal delay amount information iDIF_SERI. The output driver unit 237 may drive the external delay amount information eDIF_SERI in response to the internal delay amount information iDIF_SERI output from the serializing unit 235 to the delay amount information pad EDC.

The memory device 200 may provide the external delay amount information eDIF_SERI including the first and second delay amount information signals DIF<0:1> to the controller 100.

Accordingly, the controller 100 may adjust one of the phases of the external command clock eHCK and the external data clock eWCK in units of the coarse level or the fine level based on the external delay amount information eDIF_SERI.

In case that both of the first and second delay amount Information signals DIF<0:1> included in the external delay amount information eDIF_SERI have the logic high levels, it is determined that a delay amount corresponding to the difference between the phases of the internal command clock iHCK and the delay division clock iWCK_DLY falls in a first delay amount range. Accordingly, the controller 100 may shift backward the phase of the external data clock eWCK in units of the coarse level.

In case that the first delay amount information signal DIF<0> included in the external delay amount information eDIF_SERI has the logic high level and the second delay amount information signal DIF<1> included in the external delay amount information eDIF_SERI has the logic low level, it is determined that a delay amount corresponding to the difference between the phases of the internal command clock iHCK and the delay division clock iWCK_DLY falls in a second delay amount range. Accordingly, the controller 100 may shift backward the phase of the external data clock eWCK in units of the fine level.

The controller 100 and the memory device 200 may repeat the process of moving backward at every preset period. That is, the memory device 200 may provide the external delay amount information eDIF_SERI corresponding to the phase difference between the internal command clock iHCK and the delay division clock iWCK_DLY to the controller 100 at every preset period. The controller 100 may adjust one of the phases of the external command clock eHCK and the external data clock eWCK in units of the coarse level or the fine level based on the external delay amount information eDIF_SERI at every preset period.

In case that both of the first and second delay amount information signals DIF<0:1> included in the external delay amount information eDIF_SERI have the logic high levels for some preset periods, the controller 100 may shift backward the phase of the external data clock eWCK in units of the coarse level. After that, in case that the first delay amount Information signal DIF<0> included in the external delay amount information eDIF_SERI has the logic high level and the second delay amount information signal DIF<1> included in the external delay amount information eDIF_SERI has the logic low level during the next preset periods, the controller 100 may shift backward the phase of the external data clock eWCK in units of the fine level.

After that, when it is determined in response to the external delay amount information eDIF_SERI that the phases of the external command clock eHCK and the external data clock eWCK are identical to each other, the controller 100 may stop adjusting the phase of the external data clock eWCK. For example, in case that both of the first and second delay amount information signals DIF<0:1> included in the external delay amount information eDIF_SERI have the logic low levels, the controller 100 may fix the phase of the external data clock eWCK.

According to the exemplary embodiment described above, the semiconductor system may adjust the phase in units of the coarse level for some periods based on the phase information in the training mode, thereby minimizing time in the training mode.

Figure 7:
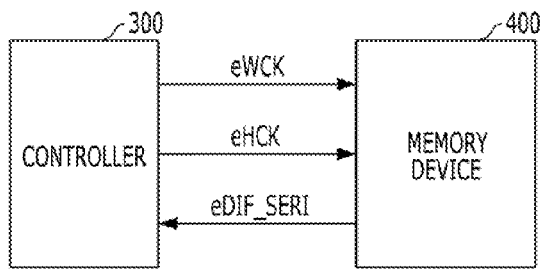
FIG. 7 is a block diagram illustrating a semiconductor system in accordance with another exemplary embodiment of the present invention.

FIG. 7 is a block diagram illustrating a semiconductor system in accordance with another exemplary embodiment of the present invention.

In accordance with the exemplary embodiment of the present invention, the semiconductor system may further shift forward as well as backward the phase of the clocks.

Referring to FIG. 7, the semiconductor system may include a controller 300 and a memory device 400.

The controller 300 may generate an external command clock eHCK and an external data clock eWCK, and adjust one of phases of the external command clock eHCK and the external data clock eWCK by a plurality of level units based on an external delay amount information eDIF_SERI in a training mode.

The memory device 400 may generate the external delay amount information eDIF_SERI in response to the external command clock eHCK and the external data clock eWCK at every preset period in the training mode.

The controller 300 may be a control unit for controlling overall operations of the memory device 400 and include a processor such as a graphic processing unit (GPU). In the training mode, the controller 300 may adjust one of the phases of the external command clock eHCK and the external data clock eWCK in units of a coarse level or a fine level based on the external delay amount information eDIF_SERI provided from the memory device 400 at every preset period.

For example, in the training mode, the controller 300 may shift backward the phase of the external data clock eWCK in units of a coarse level or a fine level based on the external delay amount information eDIF_SERI.

Further, the controller 300 in the training mode may shift forward the phase of the external data clock eWCK in units of a coarse level or a fine level based on the external delay amount information eDIF_SERI.

The controller 300 may generate the external command clock eHCK having a first frequency, for example 1 GHz, and the external data clock eWCK having a second frequency higher than the first frequency, for example 2 GHZ, since data may be input or output with a speed higher than a command. Even though not illustrated in FIG. 7, the controller 300 may provide a command and/or an address synchronized with the external command clock eHCK and data synchronized with the external data clock eWCK to the memory device 400.

The memory device 400 may generate a first internal clock by delaying the external command clock eHCK by an amount of internal delay reflected in a first internal clock path, and a second internal clock by delaying the external data clock eWCK by an amount of Internal delay reflected in a second internal clock path, and provide the external delay amount Information eDIF_SERI to the controller 300 in the training mode. The external delay amount Information eDIF_SERI may indicate where an amount of delay corresponding to a phase difference between the first and second internal clocks falls in among a plurality of preset delay amount ranges. The first internal clock may correspond to an internal command clock iHCK, and the second Internal clock may correspond to an internal data division clock iWCK_DVD.

Figure 8:
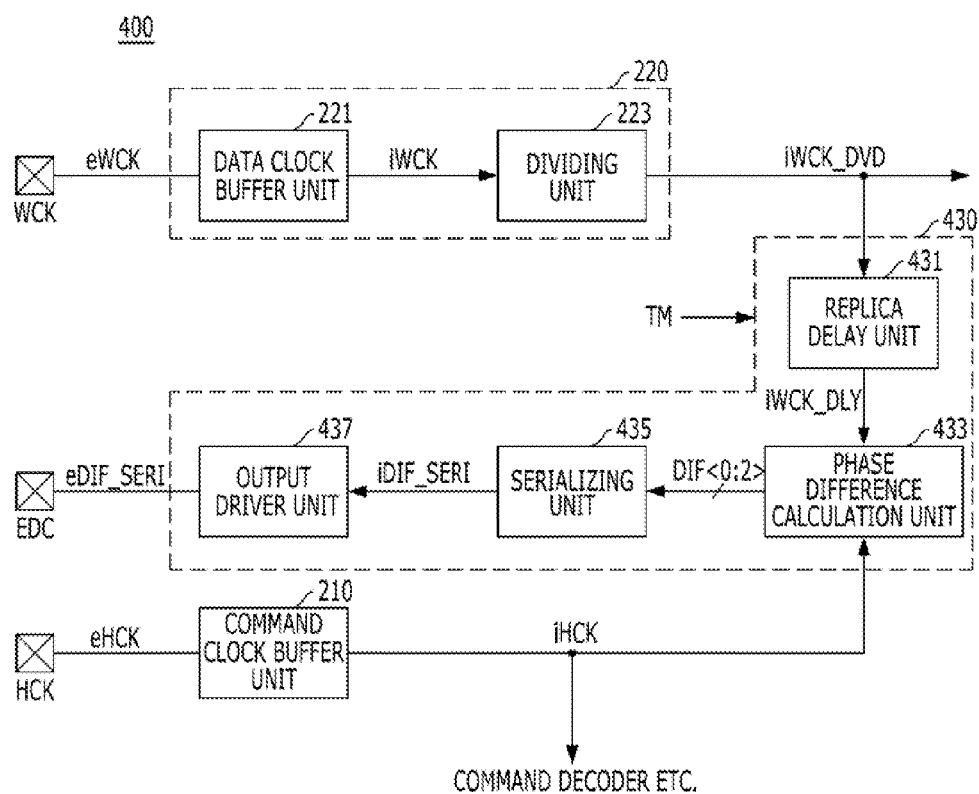
FIG. 8 is a block diagram illustrating a semiconductor device shown in FIG. 7.

FIG. 8 is a block diagram illustrating the memory device 400 shown in FIG. 7. In FIGS. 4 and 8, like reference numerals are used to refer to the same elements.

Referring to FIG. 8, the memory device 400 may include a command pad HCK, a command clock buffer unit 210, a data pad WCK, a data clock input unit 220, a delay amount information provision unit 430 and a delay amount information pad EDC.

The external command clock eHCK may be received through the command pad HCK. The command clock buffer unit 210 may generate the internal command clock iHCK in response to the external command clock eHCK. The external data clock eWCK may be received through the data pad WCK. The data clock input unit 220 may generate the internal data division clock iWCK_DVD having the same frequency as the internal command clock iHCK in response to the external data clock eWCK. The delay amount information provision unit 430 may generate the external delay amount Information eDIF_SERI corresponding to a phase difference between the internal command clock iHCK and the internal data division clock iWCK_DVD in response to a training mode signal TM. The delay amount information pad EDC outputs the external delay amount information eDIF_SERI to the controller 300.

The memory device 400 shown in FIG. 8 may have the same elements as the memory device 200 shown in FIG. 4 except for the delay amount information provision unit 430.

The delay amount information provision unit 430 may include a replica delay unit 431, a phase difference calculation unit 433, a serializing unit 435, and an output driver unit 437.

The replica delay unit 431 may output a delay division clock iWCK_DLY by delaying the internal data division clock iWCK_DVD by a modelled delay amount. The phase difference calculation unit 433 may output first to third delay amount information signals DIF<0:2> corresponding to a phase difference between the delay division clock iWCK_DLY and the internal command clock iHCK in parallel. The serializing unit 435 may serialize the first to third delay amount information signals DIF<0:2> and output an internal delay amount information iDIF_SERI. The output driver unit 437 may drive the internal delay amount information iDIF_SERI output in series from the serializing unit 435 as the external delay amount Information eDIF_SERI.

The replica delay unit 431 may be provided in order to synchronize an internal delay amount reflected in the internal command clock iHCK with an internal delay amount reflected in the internal data division clock iWCK_DVD. Even though not illustrated in FIG. 8, the internal delay amount reflected in the internal command clock iHCK is greater than the internal delay amount reflected in the internal data division clock iWCK_DVD. If the internal delay amount reflected in the internal command clock iHCK is less than the internal delay amount reflected in the internal data division clock iWCK_DVD, the replica delay unit 431 would be disposed on a transmission line of the internal command clock iHCK.

Figure 9:
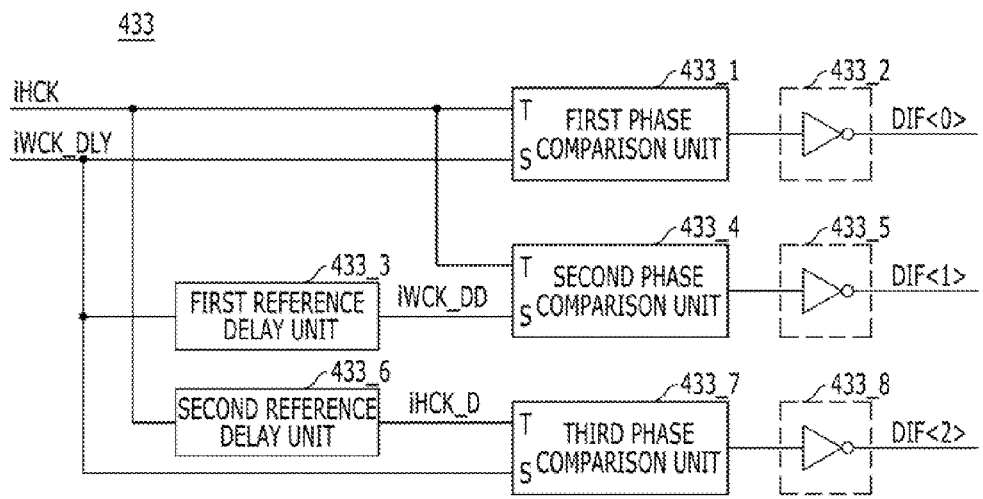
FIG. 9 is a block diagram illustrating a phase difference calculation unit shown in FIG. 8.

FIG. 9 is a block diagram illustrating the phase difference calculation unit 433 shown in FIG. 8.

Referring to FIG. 9, the phase difference calculation unit 433 may include a first phase comparison unit 433_1, a first output unit 433_2, a first reference delay unit 433_3, a second phase comparison unit 433_4, a second output unit 433_5, a second reference delay unit 433_6, a third phase comparison unit 433_7, and a third output unit 433_8.

The first phase comparison unit 433_1 may compare phases of the internal command clock iHCK and the delay division clock iWCK_DLY. The first output unit 433_2 may output an output signal of the first phase comparison unit 433_1 as the first delay amount Information signal DIF<0>. The first reference delay unit 433_3 may delay the delay division clock iWCK_DLY by a preset delay amount, and may output an additional delay division clock iWCK_DD. The second phase comparison unit 433_4 may compare phases of the internal command clock iHCK and the additional delay division clock iWCK_DD output from the first reference delay unit 433_3. The second output unit 433_5 may output an output signal of the second phase comparison unit 433_4 as the second delay amount information signal DIF<1>. The second reference delay unit 433_6 may delay the internal command clock iHCK by a preset delay amount, and may output a delay command clock iHCK_D. The third phase comparison unit 433_7 may compare phases of the delay command clock iHCK_D output from the second reference delay unit 433_6 and the delay division clock iWCK_DLY. The third output unit 433_8 may output an output signal of the third phase comparison unit 433_7 as the third delay amount information signal DIF<2>.

An operation of the semiconductor system described above will be described with reference to FIG. 10.

Figure 10:
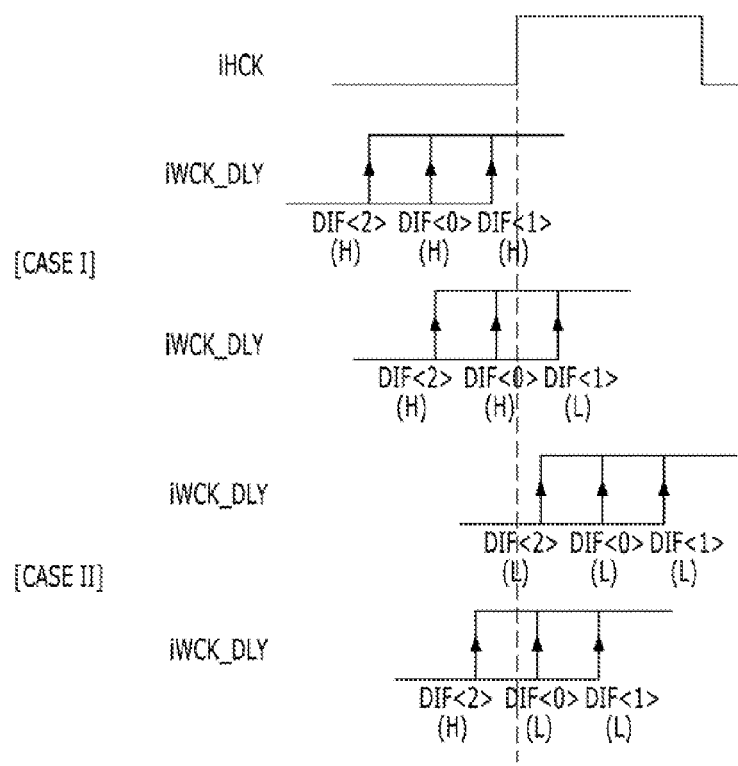
FIG. 10 is a timing diagram illustrating a training process of the semiconductor system shown in FIGS. 7 to 9.

FIG. 10 is a timing diagram illustrating a training process of the semiconductor system shown in FIGS. 7 to 9.

Referring to FIG. 10, the controller 300 may generate and provide the external command clock eHCK having a low frequency, for example 1 GHz, and the external data clock eWCK having a high frequency, for example 2 GHz, to the memory device 400 at an initial operation. The memory device 400 may internally generate the Internal command clock iHCK corresponding to the external command clock eHCK and the internal data division clock iWCK_DVD corresponding to the external data clock eWCK, and may enter the training mode under the control of the controller 300.

For example, the memory device 400 may enter the training mode when the training mode signal TM, which is stored in a mode register set (MRS), is activated in response to a preset address and a preset command output from the controller 300.

After entering the training mode in response to an activation of the training mode signal TM, the memory device 400 may provide the external delay amount information eDIF_SERI, which may indicate where the amount of delay corresponding to a phase difference between the internal command clock iHCK and the internal data division clock iWCK_DVD falls in among a plurality of preset delay amount ranges, to the controller 300.

In detail, the replica delay unit 431 may output the delay division clock iWCK_DLY by delaying the internal data division clock iWCK_DVD by the modelled delay amount. The modelled delay amount may be referred to as a fixed amount of delay corresponding to a difference between the internal delay amount reflected in the internal command clock iHCK and the internal delay amount reflected in the internal data division clock iWCK_DVD.

The phase difference calculation unit 433 may sample the phase of the delay division clock iWCK_DLY based on the phase of the internal command clock iHCK, and may generate the first delay amount information signal DIF<0> in response to the sampling result. The phase difference calculation unit 433 may sample the phase of the additional delay division clock iWCK_DD based on the phase of the internal command clock iHCK, and may generate the second delay amount information signal DIF<1> in response to the sampling result. The phase difference calculation unit 433 may sample the phase of the delay division clock iWCK_DLY based on the phase of the delay command clock iHCK_D, and generate the third delay amount information signal DIF<2> in response to the sampling result.

For example, in a first case (CASE I), the phase difference calculation unit 433 may generate the first delay amount information signal DIF<0> having a logic high level when the phase of the delay division clock iWCK_DLY leads the phase of the internal command clock iHCK. The phase difference calculation unit 433 may generate the second delay amount information signal DIF<1> having a logic high level when the phase of the additional delay division clock iWCK_DD leads the phase of the internal command clock iHCK. The phase difference calculation unit 433 may generate the third delay amount information signal DIF<2> having a logic high level when the phase of the delay division clock iWCK_DLY leads the phase of the delay command clock iHCK_D.

On the other hand, in a second case (CASE II), the phase difference calculation unit 433 may generate the first delay amount Information signal DIF<0> having a logic low level when the phase of the internal command clock iHCK leads the phase of the delay division clock iWCK_DLY. The phase difference calculation unit 433 may generate the second delay amount information signal DIF<1> having a logic low level when the phase of the internal command clock iHCK leads the phase of the additional delay division clock iWCK_DD. The phase difference calculation unit 433 may generate the third delay amount information signal DIF<2> having a logic low level when the phase of the delay command clock iHCK_D leads the phase of the delay division clock iWCK_DLY.

The serializing unit 435 may serialize the first to third delay amount information signals DIF<0:2> and output the internal delay amount information iDIF_SERI. The output driver unit 437 may drive the external delay amount information eDIF_SERI in response to the internal delay amount information iDIF_SERI output from the serializing unit 435 to the delay amount information pad EDC.

The memory device 400 may provide the external delay amount information eDIF_SERI including the first to third delay amount information signals DIF<0:2> to the controller 300.

Accordingly, the controller 300 may adjust one of the phases of the external command clock eHCK and the external data clock eWCK in units of the coarse level or the fine level based on the external delay amount information eDIF_SERI.

In the first case (CASE I) where all of the first to third delay amount information signals DIF<0:2> included in the external delay amount information eDIF_SERI have the logic high levels, it is determined that a delay amount corresponding to the difference between the phases of the internal command clock iHCK and the delay division clock iWCK_DLY falls in a first delay amount range. Accordingly, the controller 300 may shift backward the phase of the external data clock eWCK in units of the coarse level.

Thereafter, when the second delay amount Information signal DIF<1> included in the external delay amount information eDIF_SERI becomes the logic low level in a state that the first delay amount information signal DIF<0> and the third delay amount information signal DIF<2> included in the external delay amount information eDIF_SERI have the logic high levels, it is determined that a delay amount corresponding to the difference between the phases of the internal command clock iHCK and the delay division clock iWCK_DLY falls in a second delay amount range. Accordingly, the controller 300 may shift backward the phase of the external data clock eWCK in units of the fine level.

In the second case (CASE II) that all of the first to third delay amount information signals DIF<0:2> included in the external delay amount information eDIF_SERI have the logic low levels, it is determined that a delay amount corresponding to the difference between the phases of the internal command clock iHCK and the delay division clock iWCK_DLY falls in a third delay amount range. Accordingly, the controller 300 may shift forward the phase of the external data clock eWCK in units of the coarse level.

Thereafter, when the third delay amount information signal DIF<2> included in the external delay amount information eDIF_SERI becomes the logic high level in a state that the first delay amount information signal DIF<0> and the second delay amount information signal DIF<1> included in the external delay amount information eDIF_SERI have the logic low levels, it is determined that a delay amount corresponding to the difference between the phases of the internal command clock iHCK and the delay division clock iWCK_DLY falls in a fourth delay amount range. Accordingly, the controller 300 may shift forward the phase of the external data clock eWCK in units of the fine level.

The controller 300 and the memory device 400 may repeat the process of moving forward and backward at every preset period. That is, the memory device 400 may provide the external delay amount information eDIF_SERI corresponding to the phase difference between the internal command clock iHCK and the delay division clock iWCK_DLY to the controller 300 at every preset period. The controller 300 may adjust one of the phases of the external command clock eHCK and the external data clock eWCK in units of the coarse level or the fine level based on the external delay amount Information eDIF_SERI at every preset period.

In the first case (CASE I) that all of the first to third delay amount Information signals DIF<0:2> included in the external delay amount information eDIF_SERI have the logic high levels for some preset periods, the controller 300 may shift backward the phase of the external data clock eWCK in units of the coarse level. After that, when the second delay amount information signal DIF<1> included in the external delay amount information eDIF_SERI becomes the logic low level in a state that the first delay amount information signal DIF<0> and the third delay amount information signal DIF<2> included in the external delay amount information eDIF_SERI have the logic high levels during the next preset periods, the controller 300 may shift backward the phase of the external data clock eWCK in units of the fine level.

In the second case (CASE II) that all of the first to third delay amount information signals DIF<0:2> included in the external delay amount information eDIF_SERI have the logic low levels for some preset periods, the controller 300 may shift forward the phase of the external data clock eWCK in units of the coarse level. After that, when the third delay amount information signal DIF<2> included in the external delay amount information eDIF_SERI becomes the logic high level in a state that the first delay amount information signal DIF<0> and the second delay amount information signal DIF<1> included in the external delay amount information eDIF_SERI have the logic low levels during the next preset periods, the controller 300 may shift forward the phase of the external data clock eWCK in units of the fine level.

After that, when it is determined in response to the external delay amount information eDIF_SERI that the phases of the external command clock eHCK and the external data clock eWCK are identical to each other, the controller 300 may stop adjusting the phase of the external data clock eWCK. For example, in the first case (CASE I) that both of the first and second delay amount information signals DIF<0:1> included in the external delay amount information eDIF_SERI have the logic high levels, the controller 300 may fix the phase of the external data clock eWCK. In the second case (CASE II) that both of the first and third delay amount information signals DIF<0> and DIF<2> included in the external delay amount information eDIF_SERI have the logic high levels, the controller 300 may fix the phase of the external data clock eWCK.

Figure 11:
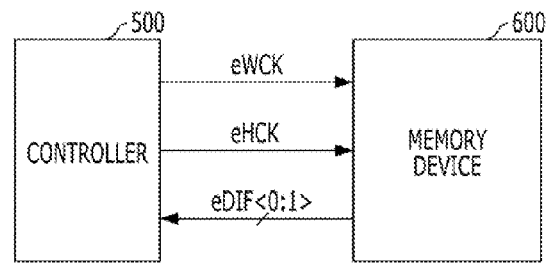
FIG. 11 is a block diagram illustrating a semiconductor system in accordance with an exemplary embodiment of the present invention.
Figure 12:
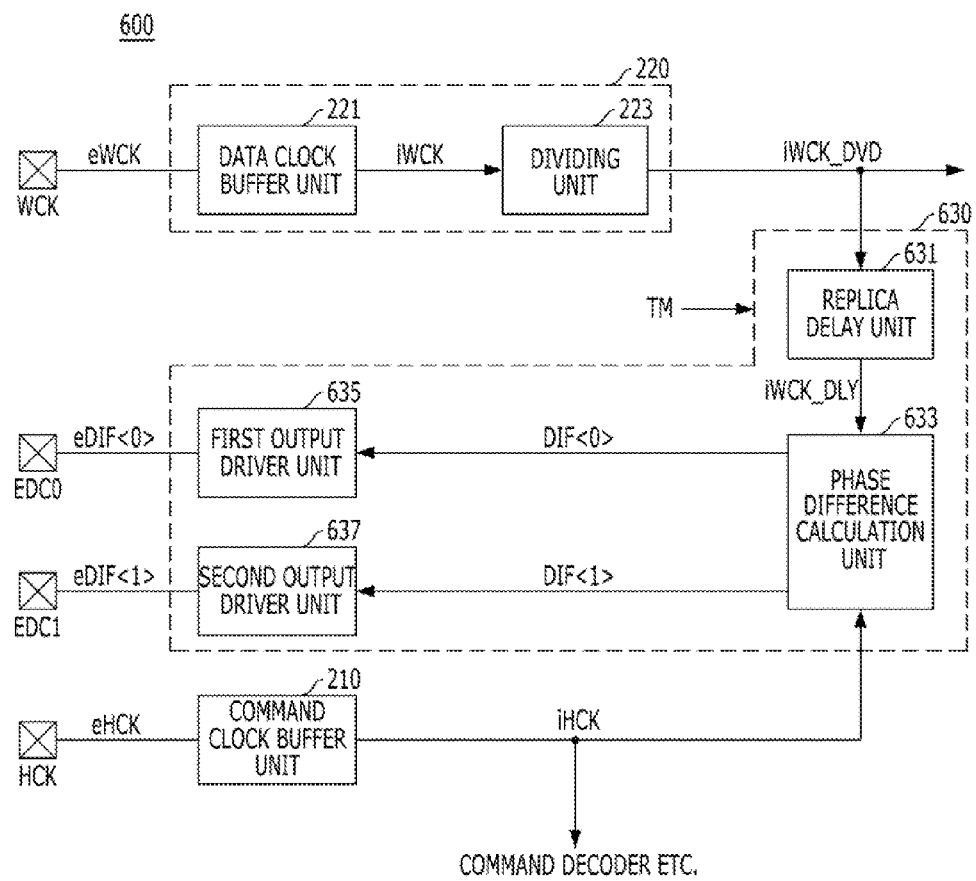
FIG. 12 is a block diagram illustrating a semiconductor device shown in FIG. 11.

FIG. 11 is a block diagram illustrating a semiconductor system in accordance with still another exemplary embodiment of the present invention. FIG. 12 is a block diagram illustrating a semiconductor device shown in FIG. 11.

Referring to FIG. 11, the semiconductor system may include a controller 500 and a memory device 600.

The controller 500 may generate an external command clock eHCK and an external data clock eWCK and may adjust one of phases of the external command clock eHCK and the external data clock eWCK by a plurality of level units based on an external delay amount information eDIF<0:1> in a training mode.

The memory device 600 may generate the external delay amount information eDIF<0:1> in response to the external command clock eHCK and the external data clock eWCK at every preset period in the training mode.

The controller 500 shown in FIG. 11 may have the same elements as the controller 100 shown in FIG. 3 except that the controller 500 may receive first and second external delay amount information eDIF<0:1> as delay amount information through corresponding channels.

The memory device 600 shown in FIGS. 11 and 12 may have the same elements as the memory device 200 shown in FIGS. 3 and 4 except that the first and second external delay amount information eDIF<0:1> are provided to first and second delay amount information pads EDC0 and EDC1 from a phase difference calculation unit 633 through first and second output driver units 635 and 637 as shown in FIG. 12.

The delay amount information pads EDC0 and EDC1 may be common pads providing different signals respectively in different operation modes. For example, the delay amount information pads EDC0 and EDC1 may be pads for providing CRC codes per region to the external device in a normal mode. Two or more common pads may be used as the delay amount information pads EDC0 and EDC1 In the training mode.

An operation of the semiconductor system shown in FIGS. 11 and 12 may be substantially the same as the semiconductor system shown in FIGS. 3 to 6.

Figure 13:
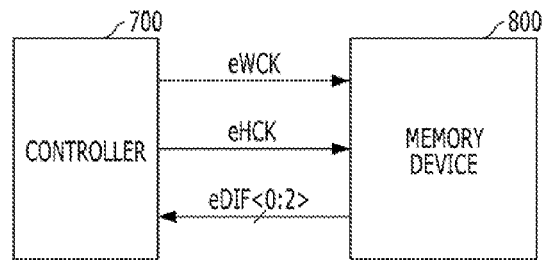
FIG. 13 is a block diagram illustrating a semiconductor system in accordance with an exemplary embodiment of the present invention.
Figure 14:
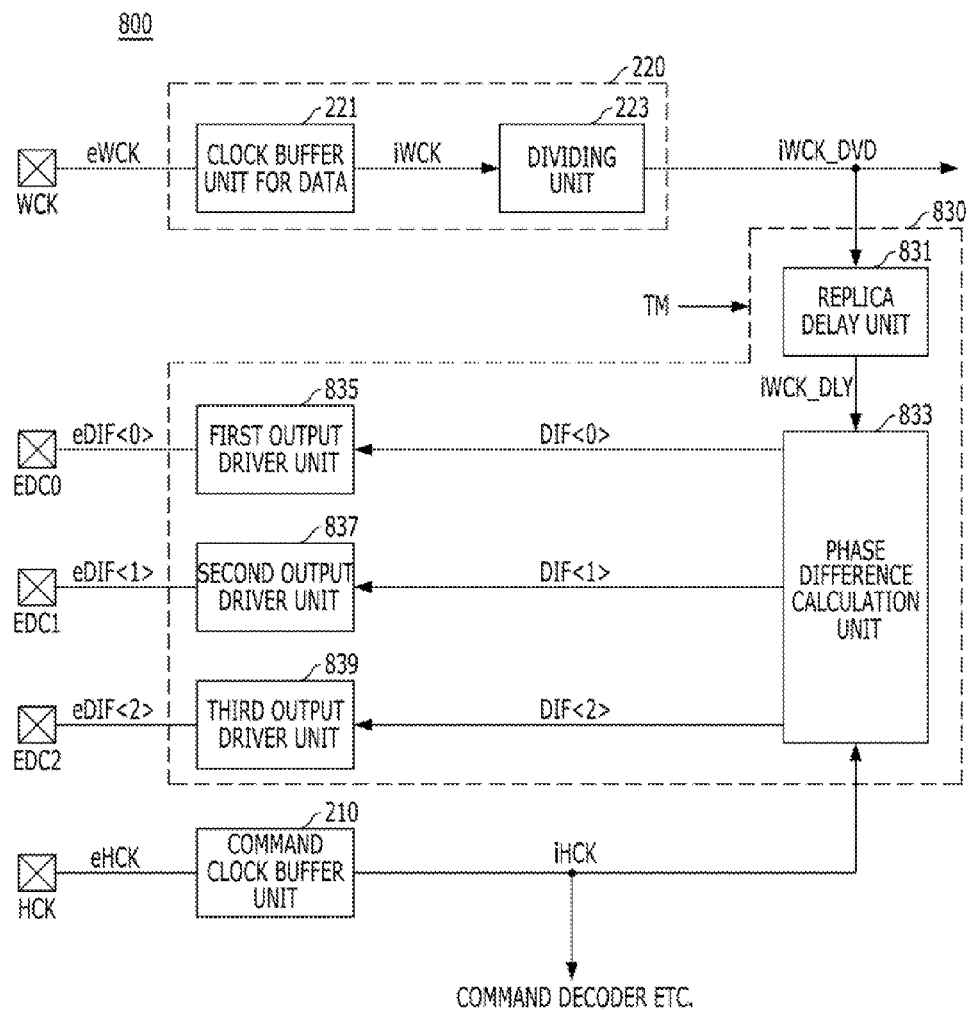
FIG. 14 is a block diagram illustrating a semiconductor device shown in FIG. 13.

FIG. 13 is a block diagram illustrating a semiconductor system in accordance with still another exemplary embodiment of the present invention. FIG. 14 is a block diagram illustrating a semiconductor device shown in FIG. 13.

Referring to FIG. 13, the semiconductor system may include a controller 700 and a memory device 800.

The controller 700 may generate an external command clock eHCK and an external data clock eWCK, and may adjust one of phases of the external command clock eHCK and the external data clock eWCK by a plurality of level units based on an external delay amount information eDIF<0:2> in a training mode.

The memory device 800 may generate the external delay amount Information eDIF<0:2> in response to the external command clock eHCK and the external data clock eWCK at every preset period in the training mode.

The controller 700 shown in FIG. 13 may have the same elements as the controller 400 shown in FIG. 7 except that the controller 700 may receive first to third external delay amount information eDIF<0:2> as delay amount information through corresponding channels.

The memory device 800 shown in FIGS. 13 and 14 may have the same elements as the memory device 400 shown in FIGS. 7 and 8 except that the first to third external delay amount information eDIF<0:2> are provided to first to third delay amount information pads EDC0 to EDC2 from a phase difference calculation unit 833 through first to third output driver units 835 to 839 as shown in FIG. 14.

The delay amount information pads EDC0 to EDC2 may be common pads providing different signals respectively in different operation modes. For example, the delay amount information pads EDC0 to EDC2 may be pads for providing CRC codes per region to the external device in a normal mode. Three or more common pads may be used as the delay amount information pads EDC0 to EDC2 in the training mode.

An operation of the semiconductor system shown in FIGS. 13 and 14 may be substantially the same as the semiconductor system shown in FIGS. 7 to 10.

While the present invention has been described with respect to the specific embodiments, it will be apparent to those skilled in the art that various changes and modifications may be made without departing from the spirit and scope of the invention as defined in the following claims.

For example, the exemplary embodiments of the present invention may adjust the phase of the clocks in units of a coarse level or a fine level in the description. However, in different embodiments, three or more levels may be used to adjust the phase of the clocks.

What is claimed is:

1. A semiconductor device comprising:
 a first internal clock generation unit suitable for generating a first internal clock for synchronizing a first signal in response to a first external clock;
 a second internal clock generation unit suitable for generating a second internal clock for synchronizing a second signal in response to a second external clock; and
 a delay amount information provision unit suitable for providing delay amount information corresponding to a phase difference between the first internal clock and the second internal clock to an external device,
 wherein the delay amount information provision unit includes:
  a replica delay unit suitable for generating a third internal clock by delaying the second internal clock by a modelled delay amount; and
  a phase difference calculation unit suitable for generating a delay amount information signal with plural bits, representing the delay amount information, in response to the first internal clock and the third internal clock.

2. The semiconductor device of claim 1, wherein the delay amount information includes information that a delay amount corresponding to the phase difference between the first internal clock and the second internal clock is greater or less than a preset reference delay amount.

3. The semiconductor device of claim 1,
 wherein the modelled delay amount corresponds to a difference between a delay amount reflected in the first internal clock and a delay amount reflected in the third internal clock.

4. A semiconductor device comprising:
 a first internal clock generation unit suitable for generating a first internal clock for synchronizing a first signal in response to a first external clock having a first frequency;
 a second internal clock generation unit suitable for generating a second internal clock for synchronizing a second signal in response to a second external clock having a second frequency that is higher than the first frequency, wherein the second internal clock has the same frequency as the first internal clock; and
 a delay amount information provision unit suitable for providing delay amount information, which indicates where a delay amount corresponding to a phase difference between the first internal clock and the second internal clock falls in among a plurality of preset delay amount ranges, to an external device in a training mode,
 wherein the delay amount information provision unit includes:
  a replica delay unit suitable for generating a third internal clock by delaying the second internal clock by a modelled delay amount; and
  a phase difference calculation unit suitable for generating the delay amount information signal with plural bits, representing the delay amount information, in response to the first internal clock and a third internal clock.

5. The semiconductor device of claim 4, wherein the delay amount information provision unit further includes:
 a serializing unit suitable for serializing the delay amount information signal with plural bits; and
 an output driver unit suitable for driving the serialized delay amount information signal to output the delay amount information, and
 wherein the modelled delay amount corresponds to a difference between a delay amount reflected in the first internal clock and a delay amount reflected in the third internal clock.

6. The semiconductor device of claim 5, wherein the phase difference calculation unit includes:
 a first phase comparison unit suitable for comparing phases of the third internal clock and the first internal clock and generating a first bit of the delay amount information signal in response to a comparison result;

a reference delay unit suitable for generating a fourth internal clock by delaying the third internal clock by a preset reference delay amount; and a second phase comparison unit suitable for comparing phases of the fourth internal clock and the first internal clock and generating a second bit of the delay amount information signal in response to a comparison result.

7. The semiconductor device of claim 5, wherein the phase difference calculation unit includes:
a first phase comparison unit suitable for comparing phases of the third internal clock and the first internal clock and generating a first bit of the delay amount information signal in response to a comparison result;
a first reference delay unit suitable for generating a fourth internal clock by delaying the third internal clock by a preset reference delay amount;
a second phase comparison unit suitable for comparing phases of the fourth internal clock and the first internal clock and generating a second bit of the delay amount information signal in response to a comparison result;
a second reference delay unit suitable for generating a fifth internal clock by delaying the first internal clock by the preset reference delay amount; and
a third phase comparison unit suitable for comparing phases of the fifth internal clock and the third internal clock and generating a third bit of the delay amount information signal in response to a comparison result.

8. The semiconductor device of claim 5, further comprising:
a first pad suitable for receiving the first internal clock from the external device;
a second pad suitable for receiving the second internal clock from the external device; and
a third pad suitable for providing the delay amount information signal output from the output driver unit to the external device.

9. The semiconductor device of claim 8, wherein the third pad includes a pad for providing a cyclic redundancy check (CRC) code to the external device in a normal mode.

10. The semiconductor device of claim 4, wherein the delay amount information provision unit includes:
a plurality of output driver units suitable for respectively driving the plural bits of the delay amount information signal, and
wherein the modelled delay amount corresponds to a difference between a delay amount reflected in the first internal clock and a delay amount reflected in the third internal clock.

11. The semiconductor device of claim 10, wherein the phase difference calculation unit includes:
a first phase comparison unit suitable for comparing phases of the third internal clock and the first internal clock and generating a first bit of the delay amount information signal in response to a comparison result;
a reference delay unit suitable for generating a fourth internal clock by delaying the third internal clock by a preset reference delay amount; and
a second phase comparison unit suitable for comparing phases of the fourth internal clock and the first internal clock and generating a second bit of the delay amount information signal in response to a comparison result, and
wherein the plurality of output driver units include:
a first output driver suitable for driving the first bit of the delay amount information signal; and
a second output driver suitable for driving the second bit of the delay amount information signal.

12. The semiconductor device of claim 11, further comprising:
a first pad suitable for receiving the first internal clock from the external device;
a second pad suitable for receiving the second internal clock from the external device;
a third pad suitable for providing the first bit of the delay amount information signal output from the first output driver to the external device; and
a fourth pad suitable for providing the second bit of the delay amount information signal output from the second output driver to the external device.

13. The semiconductor device of claim 12, wherein the third pad and fourth pads include a pad for providing a cyclic redundancy check (CRC) code to the external device in a normal mode.

14. The semiconductor device of claim 10, wherein the phase difference calculation unit includes:
a first phase comparison unit suitable for comparing phases of the third internal clock and the first internal clock and generating a first bit of the delay amount information signal in response to a comparison result;
a first reference delay unit suitable for generating a fourth internal clock by delaying the third internal clock by a preset reference delay amount;
a second phase comparison unit suitable for comparing phases of the fourth internal clock and the first internal clock and generating a second bit of the delay amount information signal in response to a comparison result;
a second reference delay unit suitable for generating a fifth internal clock by delaying the first internal clock by the preset reference delay amount; and
a third phase comparison unit suitable for comparing phases of the fifth internal clock and the third internal clock and generating a third bit of the delay amount information signal in response to a comparison result, and
wherein the plurality of output driver units include:
a first output driver suitable for driving the first bit of the delay amount information signal;
a second output driver suitable for driving the second bit of the delay amount information signal; and
a third output driver suitable for driving the third bit of the delay amount information signal.

15. The semiconductor device of claim 14, further comprising:
a first pad suitable for receiving the first internal clock from the external device;
a second pad suitable for receiving the second internal clock from the external device;
a third pad suitable for providing the first bit of the delay amount information signal output from the first output driver to the external device;
a fourth pad suitable for providing the second bit of the delay amount information signal output from the second output driver to the external device; and
a fifth pad suitable for providing the third bit of the delay amount information signal output from the third output driver to the external device.

16. The semiconductor device of claim 15, wherein the third pad to the fifth pads include a pad for providing a cyclic redundancy check (CRC) code to the external device in a normal mode.

17. A semiconductor system comprising:
a controller suitable for generating a first source clock having a first frequency and a second source clock having a second frequency that is higher than the first frequency, and adjusting one of phases of the first source clock and the second source clock by a plurality of level units based on delay amount information in a training mode; and a semiconductor device suitable for generating a first internal clock in which a first internal delay amount is reflected in response to the first source clock, and generating a second internal clock in which a second internal delay amount is reflected, in response to the second source clock, and providing the delay amount information, which indicates where a delay amount corresponding to a phase difference between the first internal clock and the second internal clock falls in among a plurality of preset delay amount ranges, to the controller in the training mode.

18. The semiconductor system of claim 17, wherein the controller adjusts one of the phases of the first source clock and the second source clock in units of a coarse level or a fine level in response to the delay amount information.

19. The semiconductor system of claim 17, wherein the semiconductor device generates a delay amount information signal with plural bits as the delay amount information, and provides the delay amount information signal with plural bits in series to the controller through a pad.

20. The semiconductor system of claim 17, wherein the semiconductor device generates a delay amount information signal with plural bits as the delay amount information, and
wherein the semiconductor device provides the delay amount information signal with plural bits in parallel to the controller through a plurality of pads.

* * * * *